United States Patent [19]

Tomko et al.

[11] 4,395,805
[45] Aug. 2, 1983

[54] JUMPER BRIDGE MACHINE

[75] Inventors: Frederick G. Tomko, Vestal; Phillip A. Ragard, Binghamton; Jack Schum, Harpursville, all of N.Y.

[73] Assignee: Universal Instruments Corporation, Binghamton, N.Y.

[21] Appl. No.: 259,176

[22] Filed: Apr. 30, 1981

[51] Int. Cl.³ .................... B23P 23/00; B23P 28/00
[52] U.S. Cl. .................... 29/33 F; 29/566.1; 29/330; 29/337
[58] Field of Search .......... 29/33 Q, 33 F, 33 R, 29/564.2, 566.1, 566.3; 72/330, 331, 329, 337; 140/105, 82

[56] References Cited

U.S. PATENT DOCUMENTS

| | | | |
|---|---|---|---|
| 1,559,835 | 11/1925 | Ziler | 72/330 |
| 1,956,756 | 5/1934 | Dillingham | 72/330 X |
| 2,228,747 | 1/1941 | Berkebil | 29/33 F |
| 2,286,885 | 6/1942 | Wiley | 72/337 |
| 2,431,012 | 12/1947 | Lang | 72/330 X |
| 2,518,029 | 8/1950 | Kruse | 72/337 |
| 3,172,449 | 3/1965 | Stanton | 72/330 |
| 3,315,512 | 4/1967 | Maciorowski | 72/330 |
| 3,488,987 | 1/1970 | Stoeckli | 72/329 |
| 3,626,994 | 12/1971 | Klenz | 72/337 X |
| 3,947,958 | 4/1976 | Bowers | 29/564.2 X |
| 3,956,917 | 5/1976 | Kerseg | 72/337 |
| 3,969,918 | 7/1976 | Bernotus | 72/337 |

*Primary Examiner*—William R. Briggs
*Attorney, Agent, or Firm*—Fidelman, Wolffe & Waldron

[57] ABSTRACT

An apparatus is disclosed for intermittently feeding wire forward along a generally longitudinal axis, cutting and forming a front end of the wire at a first station into a jumper bridge for an electronic hybrid substrate and presenting the jumper bridge at a second station for removal from the apparatus. The apparatus has a housing comprising a wire guide for supporting and guiding said wire along the longitudinal axis; a first gripper for gripping and feeding the wire to the first station during a portion of a forward stroke; a second gripper for preventing rearward movement of the wire; means for delivering the jumper bridge from the first station to the second station and presenting it for removal at the second station; a cutter and former for cutting a specified length from the front end of wire and forming it into the jumper bridge; a driver for controlling the feeding of the wire to the first station, the cutting and forming of the wire into a jumper bridge, and the delivering of the jumper bridge from the first station to the second station; and an actuator for actuating the driver during the forward and reverse strokes, upon command.

10 Claims, 11 Drawing Figures

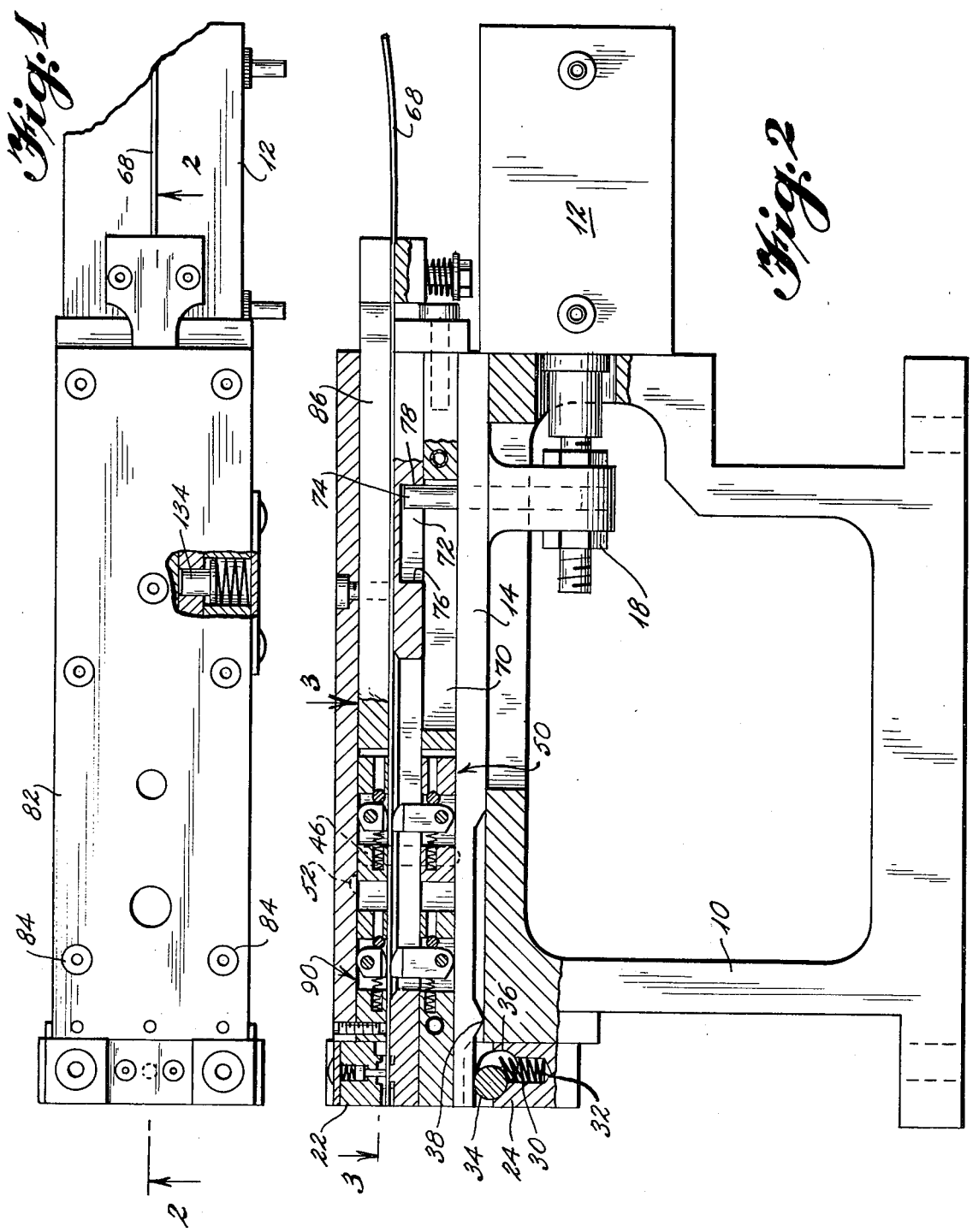

JUMPER BRIDGE MACHINE

BACKGROUND AND SUMMARY OF THE INVENTION

The invention is directed to a means for feeding wire, cutting and forming it to provide a jumper bridge for an electronic, hybrid circuit board substrate, and delivering the jumper bridge to a pick-up position for application to the substrate.

Hybrid circuits are a combination of discrete and integrated circuit techniques. As in integrated circuits, conductors, resistors and conductive lands are printed on a ceramic substrate. In thick film technology, the printed elements are generally several mils thick. Then discrete chips are precisely positioned over the conductive lands and subsequently bonded in position in a manner to complete the electrical circuit. The printed conductor lands provide a pattern which precisely matches to the solder bumps on the bottom surface of the flip chip and these bumps connect to the circuit elements within the chip. The bonded chips and substrate, with an exposed lead frame, are frequently encapsulated in toto in a potting compound for protection against physical and environmental damage. Use of unencapsulated chips on the circuit board allows for the manufacture of physically smaller circuits than those where discrete components which have already been encapsulated have their leads inserted into circuit boards fitted with receiving connectors or into pre-drilled holes wherein the leads are subsequently cut and clinched. A primary advantage of chips is their small size, some being nearly microscopic. Chips in the order of 0.030 by 0.030 inches square and 0.010 thick and solder bumps and conductor lands in the order of 0.005 inches in height and width, and spaced apart by similar distances, are not uncommon.

Frequently, due to the dense population of these hybrid components on a substrate of small size and in order to complete a specific electrical path without shorting out various other portions of the circuit, it is necessary to provide small jumper bridges between the specific electrical points of the printed circuit.

In the past, these jumper bridges have been formed, placed, and connected by hand. Accordingly, it is an object of the instant invention to provide a machine by which wire stock (preferably rectangular in cross-section) may be fed from a semi-continuous supply such as a reel, cut and formed into an appropriate sized jumper bridge, and delivered to a pick-up station for removal and placement of the jumper bridge onto the substrate. At the pick-up or removal station, an apparatus such as that disclosed in U.S. Pat. No. 4,151,945 may be used for the removal and placement of the jumper bridge.

It is a further object of the invention to provide such a machine which is relatively inexpensive and simple in design, as well as compact enough to be easily incorporated into a machine for hybrid circuit board population, so the machine may be controlled automatically by a computer or the like through valve actuation signals.

Briefly, a housing contains fixed and horizontally reciprocatable cam gripper assemblies for gripping wire stock which is fed longitudinally from rear to front of the machine. On the front of the machine is a unique cutter and former means, part of which reciprocates vertically. The other portion of the cutter and former is a reciprocatable wire guide which longitudinally supports and guides the wire stock prior to cutting and forming thereof, and which also delivers the formed jumper bridge to a removal station in an appropriate orientation for pick-up. The various horizontally and vertically reciprocatable parts of the machine are actuated by a piston and cylinder controlled driver during portions of the forward and reverse strokes.

The specific nature of the invention as well as other objects, features, and advantages and uses thereof will become apparent from the following detailed description of the preferred embodiment taken in conjunction with the accompanying drawings.

BRIEF DESCRIPTION OF THE DRAWINGS

FIG. 1 is a top plan view, partially broken away, of the machine.

FIG. 2 is a sectional view, taken along arrows 2—2 of FIG. 1.

FIG. 11 is an enlarged isometric view of the jumper bridge.

DETAILED DESCRIPTION OF THE INVENTION

Figure 7:
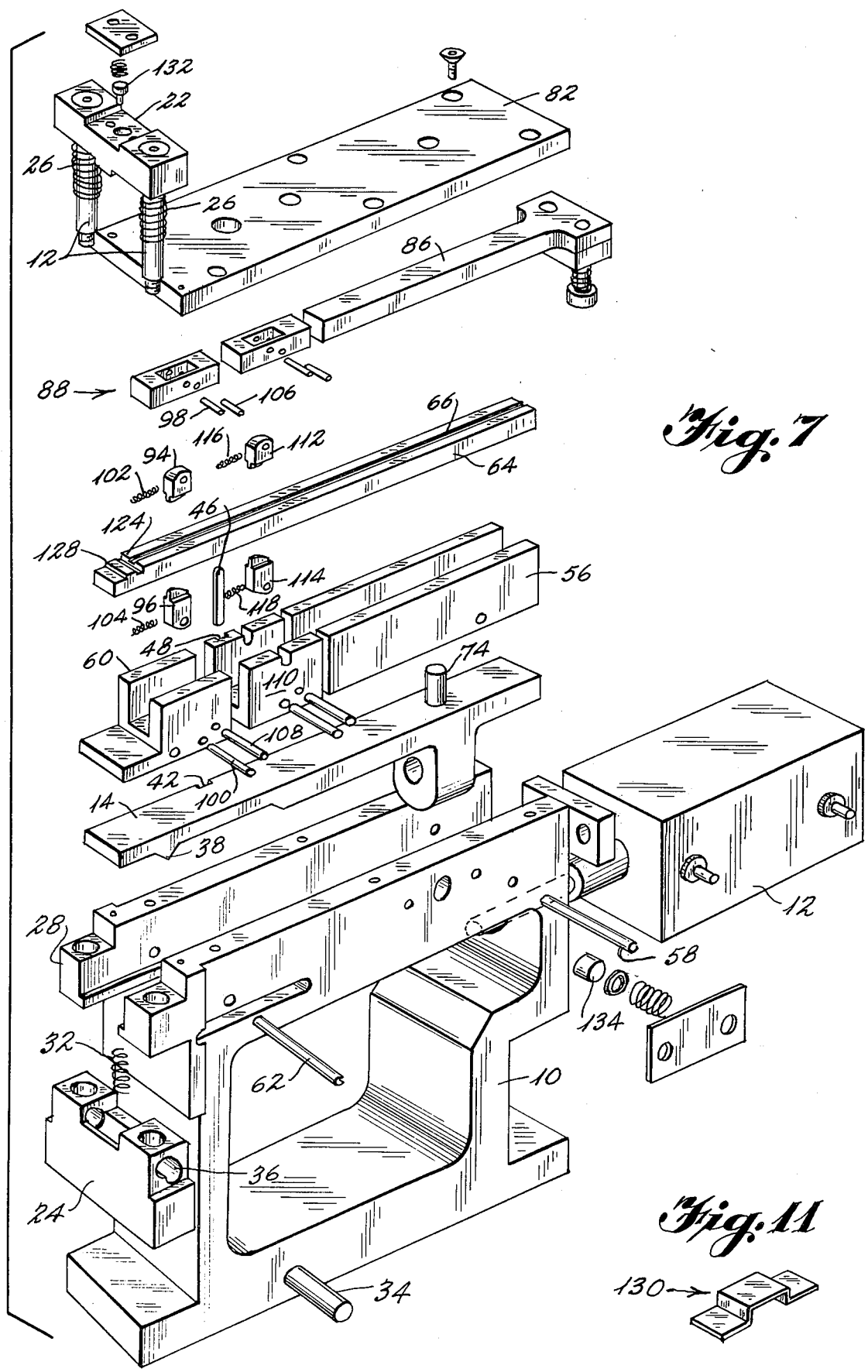
FIG. 7 is an exploded isometric view of the machine of the invention.

In referring to the drawings, the reader's attention is directed to the exploded view of FIG. 7 for a better understanding of the interrelationship of the various parts of the apparatus.

In FIG. 2, an integral base and housing 10 has a double acting piston/cylinder 12 attached for reciprocation of driver 14 in channel 16 during the forward and reverse strokes. Such a piston/cylinder is manufactured by Compact Air Products, Inc. and designated as style S-TF, 1¾" stroke by 1⅛" bore, modified front mounting, double acting. Driver 14 is attached to piston/cylinder 12 by a threaded rod extender and nut arrangement 18 such that the initial position of driver 14 relative to housing 10 is adjustable left and right. A pair of shoulder screws 20 (FIG. 5) telescope into the left-hand or forward end of housing 10 to support vertically moveable blocks 22, 24. Compression springs 26 surround shoulder screws 20 and are interposed between upper block 22 and housing portion 28 to bias blocks 22, 24 to the upward position. Screws 20 are threaded into lower block 24 and are slideably received in upper block 22, with the heads of the screws providing the upper limit of movement of upper block 22. By threading screws 20 clockwise or counterclockwise, the separation between blocks 22 and 24 may be adjusted.

Lower block 24 also has a vertical bore 30 for reception of a compression spring 32 to bias the ends of a cam roll 34 upwardly against a surface of compound radius as at 36 which is formed by drilling two adjoining lateral bores. During the forward stroke of driver 14, triangular cam surface 38 engages cam roll 34 which is already in its most vertical position. Due to surface 40 of lower block 24, upper and lower blocks 22, 24 are moved downwardly and returned upwardly by springs 26 as cam roll 34 follows the triangular cam surface 38. However, due to the unique compound radius at 36, cam roll 34 is free to move to the right and downward along radius 36 under the influence of triangular shaped cam surface 38 during the reverse stroke of driver 14, without causing vertical reciprocation of blocks 22, 24. Spring 32 causes cam roll 34 to follow radius 36 back to the uppermost position of biasing after triangular cam surface 38 has passed over it in the reverse stroke.

Figure 3:
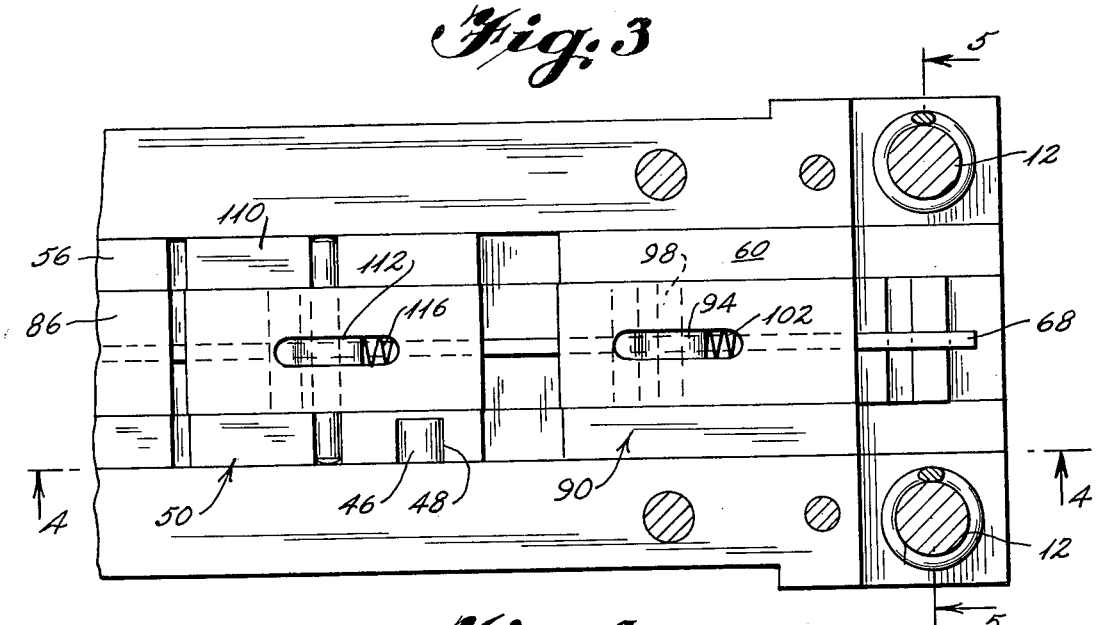
FIG. 3 is a sectional view, taken along arrows 3—3 of FIG. 2.
Figure 4:
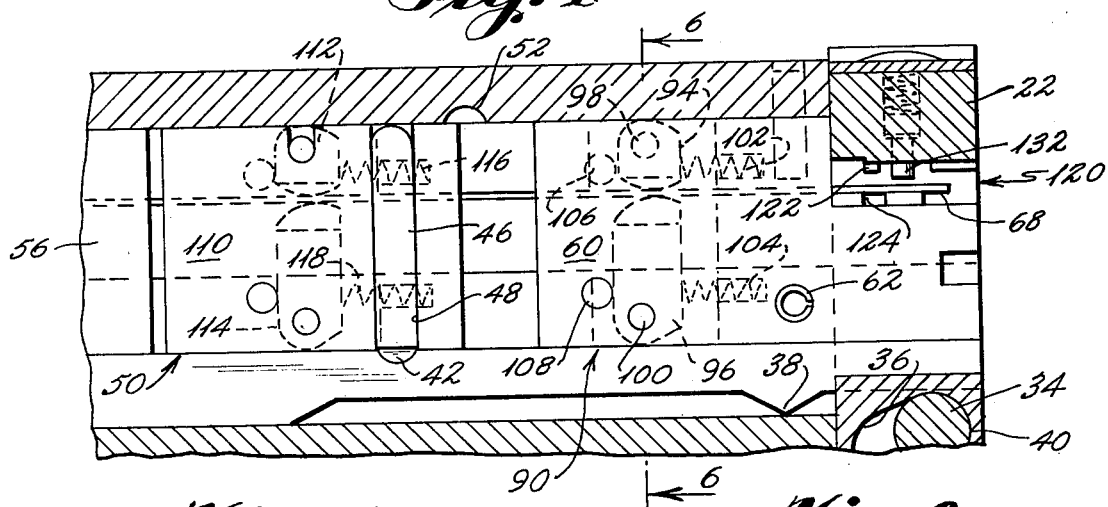
FIG. 4 is a sectional view, taken along arrows 4—4 of FIG. 3.

Referring to FIGS. 3 and 4 (in which "forward" is viewed as to the right), driver 14 is provided with a dimple 42 for receiving the bottom end of a drive key 46 during a portion of the forward and reverse strokes. Drive key 46 rides in a vertical channel 48 of a horizontally reciprocable wire gripper assembly 50, with the upper end of key 46 adapted to ride into a dimple 52, as will be explained further along in the detailed description.

Figure 5:
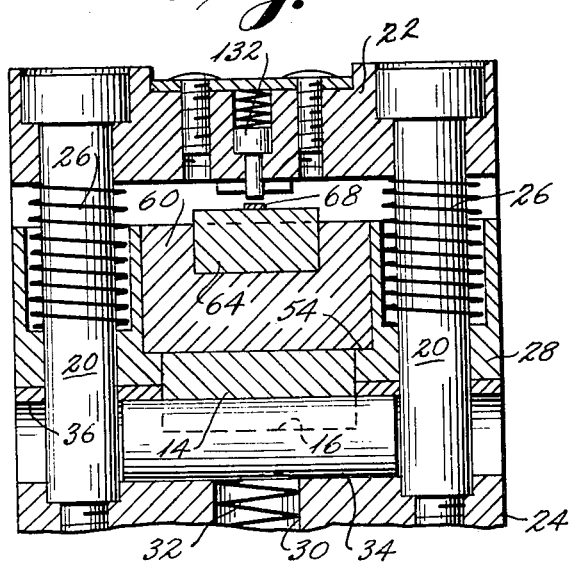
FIG. 5 is a sectional view, taken along arrows 5—5 of FIG. 3.
Figure 6:
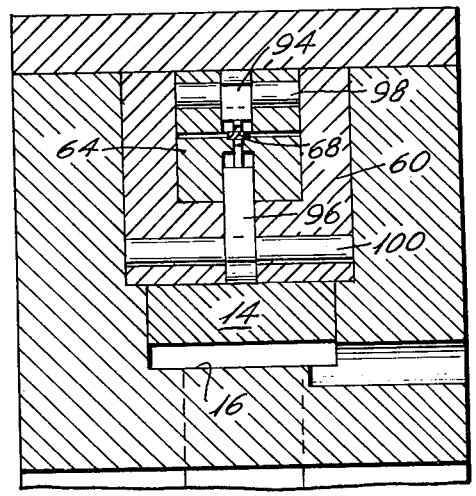
FIG. 6 is a sectional view, taken along arrows 6—6 of FIG. 4.

As best seen in FIGS. 5 and 6, housing 10 is provided with a wider, wire guide channel 54 above driver channel 16. From FIG. 7, one can see that rear bearing block 56 is secured in channel 54 by roll pins 58 and front bearing block 60 is secured in channel 54 by roll pins 62. Slideably received in front and rear bearing blocks 60, 56 is reciprocable wire guide 64 having small channel 66 serving as the means for defining the path of feed of wire 68 through the machine. Rear bearing block 56 is provided with a slot 70, and wire guide 64 is provided with a groove 72, such that driver 14 may cause reciprocation of wire guide 64 during the forward and reverse strokes through engagement of a vertical rod 74 with the left and right limits 76, 78 of groove 72. Wire guide 64 is also provided with a slot 80 which intersects with wire channel 66 for a reason yet to be explained. A cover plate 82 is affixed to housing 10 by machine screws, such as 84, and has an integral or attached bar 86 which fits into rear bearing block 56 to define a cover for wire channel 66 throughout the length of rear bearing block 56. Also attached to cover plate 82 is the upper portion 88 of a stationary wire gripper assembly 90. The lower portion 92 of the stationary wire gripper assembly 90 is integral with front bearing block 60, and upper portion 88 fits into front bearing block 60, as best seen in FIG. 6. The bottom of cover plate 82 further comprises dimple 52 as seen in FIG. 4.

Stationary wire gripper assembly 90 further comprises upper and lower wire gripping cams 94, 96 pivotal about support pins 98, 100 and biased rearwardly by compression springs 102, 104 into engagement with stop pins 106, 108. Wire gripping cams 94, 96 are designed such that their tips extend into the path of feed of wire 68 through wire channel 66 of wire guide 64. Referring to FIG. 4, these wire gripping cams 94, 96 will allow passage of wire 68 to the right (or forward end) of the machine, while clamping the wire 68 and preventing movement thereof rearward or to the left. Again referring to FIGS. 3 and 4, moveable wire gripper assembly 50 comprises a block 110 which is slideable in channel 54 between front and rear bearing blocks 60, 56 under the control of driver 14. This gripper assembly 50 has upper and lower spring biased cam wire grippers 112, 114 similar to those of stationary gripper assembly 90. Block 110 also receives vertically reciprocable drive key 46 and is shown in the "gripping position" in FIG. 4, with drive key 46 engaged in dimple 42 of driver 14. As driver 14 is stroked forward, moveable gripper assembly 50 is keyed thereto until drive key 46 aligns with dimple 52 of cover plate 82. Further, forward movement of driver 14 causes key 46 to move upwardly into dimple 52 so that gripper assembly 50 is halted at a "releasing position". During forward movement of gripper assembly 50, cam grippers 112, 114 grip and feed wire 68; upon halting of gripper assembly 50 at the "releasing position", further forward movement of wire 68 will cause cam grippers 112, 114 to pivot against the bias of springs 116, 118 and prevent gripping thereof. While in the "releasing position", cam grippers 112, 114 also assist grippers 94, 96 in preventing rearward movement of wire 68. Moveable wire gripper assembly 50 remains in the "releasing position" until dimple 42 of driver 14 aligns with key 46 during the reverse stroke so that key 46 may reengage with driver 14 to return gripper assembly 50 to the "gripping position".

Figure 8:
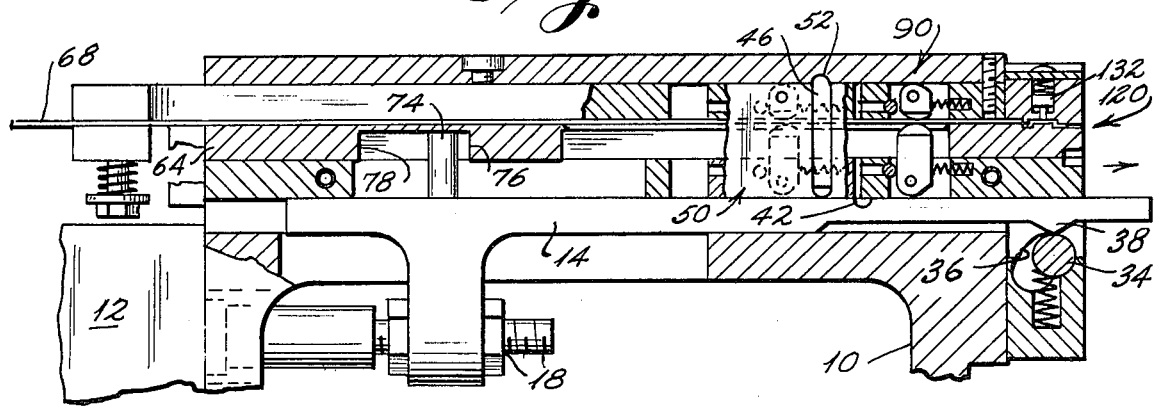
FIGS. 8–10 are enlarged, partial side elevations, depicting forming of the jumper bridge at one station and delivering the jumper bridge to the removal station.
Figure 9:
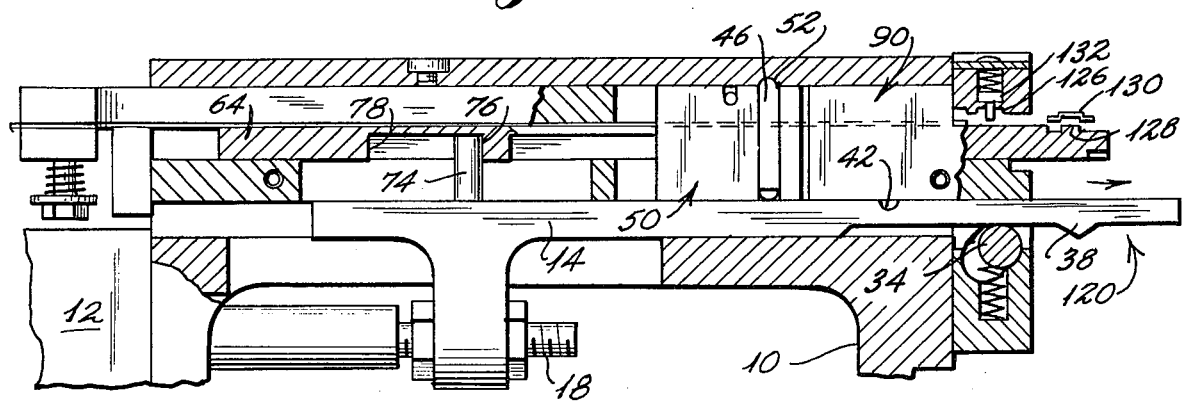
Figure 10:
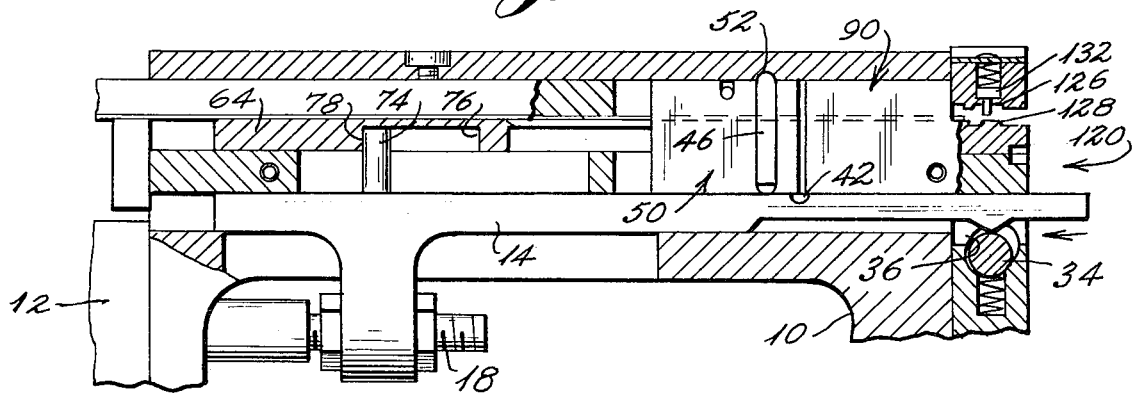

The front end of wire guide 64 comprises the lower portion of a cutter and former assembly 120; and the bottom surface of top block 22 comprises the upper portion of assembly 120. As seen in FIGS. 8-10, the wire 68 is cut by cutting surface 122 passing downwardly across die surface 124 of wire guide 64. Simultaneously, the forming surface 126 of upper block 22 mates with forming surface 128 of wire guide 64 to form the jumper bridge 130 of FIG. 11 at the cutting and forming station.

OPERATION

Groove 72 of wire guide 64 allows vertical rod 74 of driver 14 to slide relative to wire guide 64 during a portion of the forward stroke, from the position of FIG. 2 till engagement of rod 74 with the left-hand end 76 of groove 72. With the apparatus in the position of FIG. 2, a forward stroke of piston/cylinder 12 causes driver 14 to move to the left, and vertical rod 74 slides leftward relative to wire guide 64 in groove 72. Wire gripper assembly 50 is keyed to move with driver 14 by key 46 until alignment with dimple 52. During the movement of gripper assembly 50 of key 46 forward, gripper cams 112, 114 are gripping wire 68 to feed it forward along wire channel 66, and gripping cams 94, 96 are allowing the wire 68 to pass therethrough.

Prior to engagement of triangular cam surface 38 of driver 14 with cam roll 34 in the forward stroke, gripper assembly 50 and wire 68 are halted. As seen in FIG. 8, cam surface 38 crosses cam roll 34 during another portion of the forward stroke (prior to rod 74 engaging the right-hand end 76 of groove 72) to cause vertical reciprocation of the upper portion of the cutting and forming assembly 120 into cooperating engagement with lower portion 128 (the top, front end of wire guide 64) to engage, cut, and form wire 68 into the jumper bridge 130 of FIG. 11. Spring biased ejector 132 assures that jumper bridge 130 remains on the lower portion 128 of the cutting and forming assembly 120 during the return, upward movement of block 22. Further forward movement of driver 14 causes rod 74 to engage the right-hand end 76 of groove 72 to move wire guide 64 so that the front end thereof delivers jumper bridge 130 to the removal station, as depicted in FIG. 9, whereupon jumper bridge 130 may be removed by such as the "pick and place" head of U.S. Pat. No. 4,135,558. During the reverse stroke of FIG. 10, driver 14 rekeys with moveable gripper assembly 50 to return it to the "gripping position" and rod 74 engages the left-hand end 78 of groove 72 to return wire guide 64 to the position of FIG. 2, whereupon recycling may take place.

When loading the machine with wire 68, it is only necessary that wire 68 be hand-fed forward until gripper assembly 50 can engage the front end thereof, whereupon piston/cylinder 12 is fired until one complete jumper bridge 130 is delivered to the removal station. For ease of loading, wire channel 66 is flared (not shown) at the rear end of wire guide 64 to receive the front end of wire 68.

To prevent wire guide 64 from inadvertently returning during the reverse stroke, prior to engagement of rod 74 with left-hand end 78 of groove 72 (FIG. 10), a spring biased friction pin 134 (FIG. 1) is mounted through housing 10 and rear bearing block 56 for frictional contact with wire guide 64.

The length and shape of jumper bridge 130 is variable according to the circuit design and component placement on the substrate. Accordingly, different shapes and sizes may be used for the upper and lower forming surfaces 126, 128. The generally rectangular cross-section of the wire stock from which jumper bridge 130 is formed (as seen in FIG. 11) is believed to provide greater structural strength and retention of form.

It is to be understood that the present invention is not limited to the preferred embodiment disclosed herein, and that many modifications in construction, arrangement, use and operation are possible within the true spirit of the invention. The present invention accordingly is to be considered as including all such modifications and variations coming within the scope of the appended claims.

What is claimed is:

1. An apparatus for intermittently feeding wire forward along a generally longitudinal axis, cutting and forming a front end of said wire at a first station into a jumper bridge for an electronic hybrid substrate and presenting said jumper bridge at a second station for removal from said apparatus, said apparatus having a housing comprising:
    wire guide means for supporting and guiding said wire along said longitudinal axis;
    reciprocable means feeding said wire to said first station during a portion of a forward stroke including first gripper means for gripping said wire, and second gripper means for preventing rearward movement of said wire during a reverse stoke;
    delivery means for delivering said jumper bridge from said first station to said second station and presenting said jumper bridge for removal at said second station;
    cutting and forming means for cutting a specified length of said front end of wire and for forming said specified length into said jumper bridge;
    driver means comprising means for controlling said feeding means, means for controlling said cutting and forming means, and means for controlling said delivering means; and
    actuator means for actuating said driver means during said forward and reverse strokes, upon command.

2. An apparatus as in claim 1, wherein said first gripper means is reciprocable between a gripping position and a releasing position and said apparatus further comprises:
    a drive key means for engaging said first gripper means with said driver means during a portion of said forward and reverse strokes to facilitate reciprocation of said first gripper means between said gripping and releasing positions.

3. An apparatus as in claim 2, wherein said first gripper means comprises:
    first spring biased cam means for gripping said wire at said gripping position and feeding said wire during a portion of said forward stroke to said releasing position and for releasing said wire during said reverse stroke.

4. An apparatus as in claim 1, wherein said second gripper means is fixed relative to said housing and comprises:
    second spring biased cam means for allowing feeding of said wire forward and for preventing said wire from moving rearward.

5. An apparatus as in claim 1, wherein said actuator means comprises:
    a double acting piston and cylinder.

6. An apparatus as in claim 1, wherein said cutting and forming means comprises:
    a bottom die and a top cutting edge cooperable with said bottom die to shear a specified length of wire from said front end by vertical reciprocation of said cutting edge across said bottom die; and
    bottom and top forming surface means for forming said specified length into said jumper bridge.

7. An apparatus as in claim 6, wherein said driver means comprises a driver cam surface and said cutting and forming means further comprises:
    a spring biased cam roll engageable with said driver cam surface in said forward and reverse strokes, such that said cam roll resists said driver cam surface and said top cutting edge and said top forming surface are reciprocated on said forward stroke, and such that said cam roll does not resist said driver cam surface on said reverse stroke.

8. An apparatus as in claim 6, wherein said wire guide means is reciprocable along said longitudinal axis under the control of said driver means and further comprises:
    a forward end comprising said bottom die and said bottom former surface, such that said jumper bridge is delivered by said wire guide means from said first station to said second station and presented for removal therefrom.

9. An apparatus as in claim 6, wherein said cutting and forming means further comprises:
    an ejector means for preventing said jumper wire from sticking to said top forming surface.

10. An apparatus as in claim 6, wherein said cutting and forming means further comprises:
    upper and lower blocks, said upper block comprising said top cutting edge and said top forming surface and being telescopically attached to machine screws, said machine screws being threaded into said lower block, and spring means, interposed between said upper and lower block, for biasing said blocks apart by an amount determined by adjustment of said machine screws into said bottom block.

* * * * *